(12) United States Patent
Ahmed et al.

(10) Patent No.: US 7,084,018 B1
(45) Date of Patent: *Aug. 1, 2006

(54) SACRIFICIAL OXIDE FOR MINIMIZING BOX UNDERCUT IN DAMASCENE FINFET

(75) Inventors: Shibly S. Ahmed, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 113 days.

This patent is subject to a terminal disclaimer.

(21) Appl. No.: 10/838,228

(22) Filed: May 5, 2004

(51) Int. Cl.
*H01L 21/84* (2006.01)

(52) U.S. Cl. .............. 438/156; 438/149; 438/157; 438/268; 257/329; 257/347; 257/623

(58) Field of Classification Search .......... 257/347, 257/329, 623; 438/149, 156, 157, 268
See application file for complete search history.

(56) References Cited

U.S. PATENT DOCUMENTS

| | | | |
|---|---|---|---|
| 5,801,397 A | 9/1998 | Cunningham | 257/66 |
| 5,960,270 A | 9/1999 | Misra et al. | 438/197 |
| 6,252,284 B1 * | 6/2001 | Muller et al. | 257/412 |
| 6,265,256 B1 | 7/2001 | An et al. | 438/201 |
| 6,303,447 B1 | 10/2001 | Chhagan et al. | 438/299 |
| 6,342,410 B1 | 1/2002 | Yu | 438/164 |
| 6,396,108 B1 | 5/2002 | Krivokapic et al. | 257/365 |
| 6,406,951 B1 | 6/2002 | Yu | 438/183 |
| 6,413,802 B1 * | 7/2002 | Hu et al. | 438/151 |
| 6,458,662 B1 | 10/2002 | Yu | 438/286 |
| 6,465,823 B1 | 10/2002 | Yagishita et al. | 257/288 |
| 6,475,890 B1 | 11/2002 | Yu | 438/574 |
| 6,509,611 B1 | 1/2003 | Park et al. | 257/330 |
| 6,515,320 B1 | 2/2003 | Azuma et al. | 257/288 |
| 6,525,403 B1 | 2/2003 | Inaba et al. | 257/618 |
| 6,551,885 B1 | 4/2003 | Yu | 438/300 |
| 6,551,886 B1 | 4/2003 | Yu | 438/300 |
| 6,562,665 B1 | 5/2003 | Yu | 438/149 |
| 6,583,469 B1 * | 6/2003 | Fried et al. | 257/329 |
| 6,642,090 B1 * | 11/2003 | Fried et al. | 438/164 |
| 6,645,797 B1 * | 11/2003 | Buynoski et al. | 438/157 |
| 6,686,231 B1 | 2/2004 | Ahmed et al. | 438/164 |

(Continued)

FOREIGN PATENT DOCUMENTS

EP 1 383 164 A1 1/2004

(Continued)

OTHER PUBLICATIONS

Stephen H. Tang et al., "Comparison of Short-Channel Effect and Offstate Leakage in Symmetric vs. Asymmetric Double Gate MOSFETs", IEEE International SOI Conference, Oct. 2000, pp. 120-121.

(Continued)

*Primary Examiner*—Bradley K. Smith
*Assistant Examiner*—Steven J. Fulk
(74) *Attorney, Agent, or Firm*—Harrity Snyder, LLP (57) ABSTRACT

A method of reducing buried oxide undercut during FinFET formation includes forming a fin on a buried oxide layer and forming a source region adjacent a first end of the fin and a drain region adjacent a second end of the fin. The method further includes forming a sacrificial oxide layer over the fin and source and drain regions and forming a gate over the fin, wherein the sacrificial oxide layer reduces undercutting of the buried oxide layer during gate formation.

17 Claims, 12 Drawing Sheets

U.S. PATENT DOCUMENTS

| | | | |
|---|---|---|---|
| 6,689,650 B1 * | 2/2004 | Gambino et al. | 438/157 |
| 6,764,884 B1 | 7/2004 | Yu et al. | 438/157 |
| 6,765,303 B1 | 7/2004 | Krivokapic et al. | 257/903 |
| 6,815,268 B1 * | 11/2004 | Yu et al. | 438/149 |
| 6,855,990 B1 | 2/2005 | Yeo et al. | 257/353 |
| 6,933,183 B1 * | 8/2005 | Beintner et al. | 438/157 |
| 6,962,843 B1 * | 11/2005 | Anderson et al. | 438/212 |
| 2002/0153587 A1 * | 10/2002 | Adkisson et al. | 257/510 |
| 2002/0177263 A1 | 11/2002 | Hanafi et al. | 438/183 |
| 2003/0111686 A1 | 6/2003 | Nowak | |
| 2003/0113970 A1 | 6/2003 | Fried et al. | |
| 2003/0141525 A1 | 7/2003 | Nowak | |
| 2003/0151077 A1 | 8/2003 | Mathew et al. | |
| 2004/0036095 A1 * | 2/2004 | Brown et al. | 257/296 |
| 2004/0145019 A1 * | 7/2004 | Dakshina-Murthy et al. | 257/349 |
| 2004/0219722 A1 * | 11/2004 | Pham et al. | 438/157 |
| 2005/0104091 A1 | 5/2005 | Tabery et al. | 257/213 |
| 2005/0153492 A1 * | 7/2005 | Ahmed et al. | 438/183 |

FOREIGN PATENT DOCUMENTS

WO     WO 03/015182 A2     2/2003

OTHER PUBLICATIONS

Co-pending U.S. Appl. No. 10/720,166, filed Nov. 25, 2003 entitled: "Damascene Gate Process with Sacrificial Oxide in Semiconductor"; 19 page specification, 10 sheets of drawings.

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub-50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/320,536, filed Dec. 17, 2002 entitled: "FinFET Gate Formation Using Reverse Trim of Dummy Gate," 14 page specification, 11 sheets of drawings.

Co-pending U.S. Appl. No. 10/459,589, filed Jun. 12, 2003 entitled: "FinFET Gate Formation Using Reverse Trim and Oxide Polish," 17 page specification, 28 sheets of drawings.

Co-pending U.S. Appl. No. 10/754,559, filed Jan. 12, 2004 entitled: "Damascene Tri-Gate Finfet," 15 page specification, 13 sheets of drawings.

Co-pending U.S. Appl. No. 10/645,577, filed Aug. 22, 2003 entitled: "Sacrificial Oxide Protection During Dummy Gate Removal In Damascene Gate Process in Semiconductor Devices", 19 page specification, 9 sheets of drawings.

* cited by examiner

CROSS SECTIONAL VIEW

SACRIFICIAL OXIDE FOR MINIMIZING BOX UNDERCUT IN DAMASCENE FINFET

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET formed using, for example, a damascene process that employs sacrificial oxide to reduce buried oxide undercut that may occur during gate formation. Formation of a gate over a FinFET fin may, for example, involve etching of a semiconducting material. This etching process may result in undercutting of a buried oxide layer upon which the FinFET fin, source, drain and gate regions have been formed. Sacrificial oxide, consistent with the invention, may be formed upon the FinFET fin prior to gate formation to protect the fin and buried oxide during etching such that buried oxide undercutting is minimized.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of reducing buried oxide undercut during FinFET formation. The method includes forming a fin on a buried oxide layer and forming a source region adjacent a first end of the fin and a drain region adjacent a second end of the fin. The method further includes forming a sacrificial oxide layer over the fin and source and drain regions and forming a gate over the fin, wherein the sacrificial oxide layer reduces undercutting of the buried oxide layer during gate formation.

According to another aspect of the invention, a structure for reducing buried oxide undercut during fin field effect transistor formation is provided. The structure includes a buried oxide layer and a fin disposed on the buried oxide layer. The fin includes a plurality of surfaces and has a source region and a drain region formed adjacent each end of the fin. The structure further includes a sacrificial oxide layer formed on exposed surfaces of the fin and source and drain regions. The sacrificial oxide layer reduces undercutting of the buried oxide layer during subsequent gate formation.

According to an additional aspect of the invention, a method of forming a fin field effect transistor includes forming a fin upon a buried oxide layer and forming a source region adjacent a first end of the fin and a drain region adjacent a second end of the fin. The method further includes forming a sacrificial oxide layer over the fin and source and drain regions and depositing a layer comprising a first material over the fin and sacrificial oxide layer. The method also includes etching the layer comprising the first material to form a dummy gate, wherein the sacrificial oxide layer reduces undercutting of the buried oxide layer during the etching. The method additionally includes depositing a dielectric layer over the dummy gate and source and drain regions and planarizing the dielectric layer to expose a top surface of the dummy gate, removing a layer comprising the first material to form a trench in the dielectric layer. The method further includes forming a gate insulation layer in the trench and forming a final gate in the trench.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an exemplary damascene process for forming a FinFET that minimizes buried oxide undercutting is provided. In the exemplary damascene process, a sacrificial oxide layer is formed over the FinFET fin such that subsequent etching to form the FinFET gate does not undercut the buried oxide layer upon which the fin has been formed. After formation of the sacrificial oxide layer, a dummy gate may be formed from a layer of semiconducting material, such as, for example, polysilicon, over the sacrificial oxide layer and the fin. A dielectric layer may then be formed over the FinFET fin, source and drain regions around the dummy gate. The dummy gate may then be removed to create a gate trench in the dielectric layer. A gate may then be formed in the created gate trench to complete the damascene process.

Figure 1:
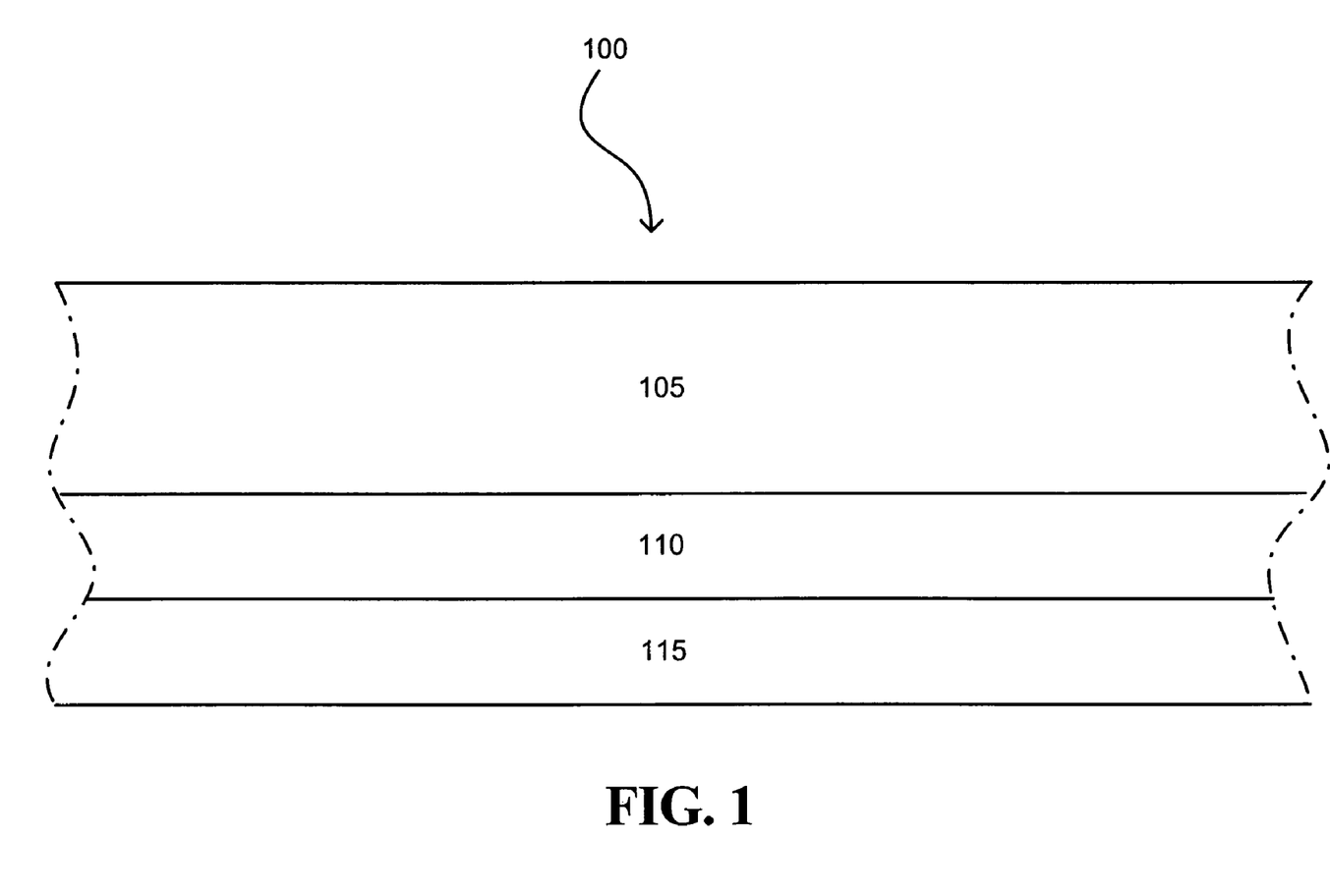
FIG. 1 illustrates exemplary layers of a silicon-on-insulator (SOI) wafer that may be used for forming a fin of a FinFET consistent with the present invention.

FIG. 1 illustrates a cross-section of a silicon on insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 500 Å to about 2000 Å and the thickness of buried oxide layer 110 may range, for example, from about 1000 Å to about 3000 Å. Fin layer 105 and substrate 115 may include, for example, silicon, though other semiconducting materials, such as germanium, may be used.

Figure 2A:
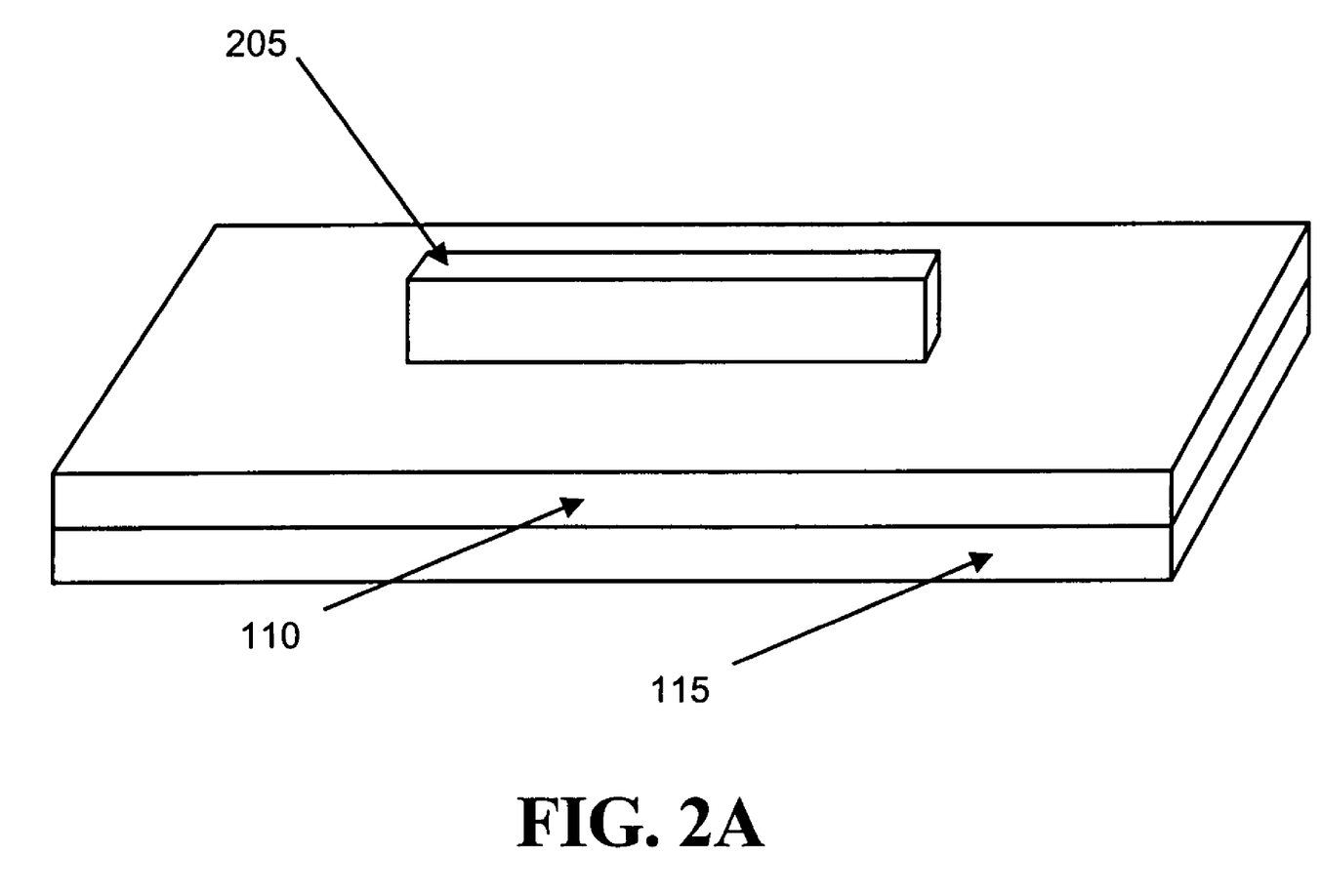
FIG. 2A illustrates an exemplary fin consistent with the invention.
Figure 2B:
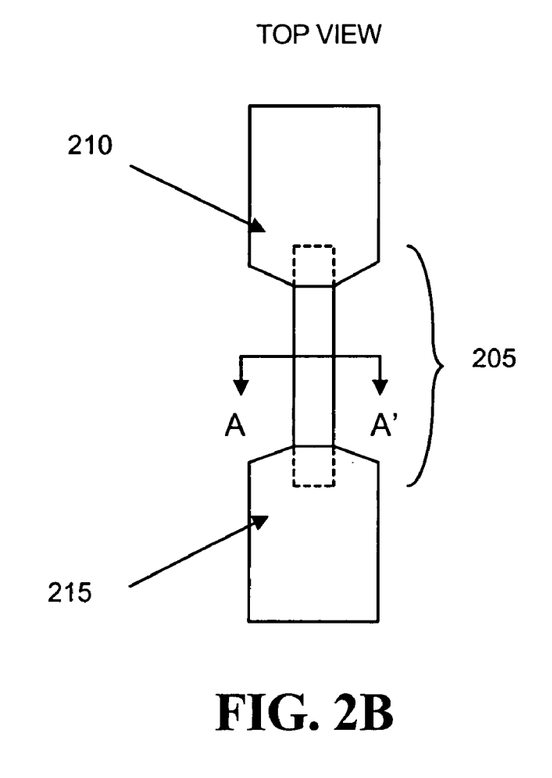
FIGS. 2B and 2C illustrate source and drain regions formed adjacent the fin of FIG. 2A consistent with the invention.
Figure 2C:
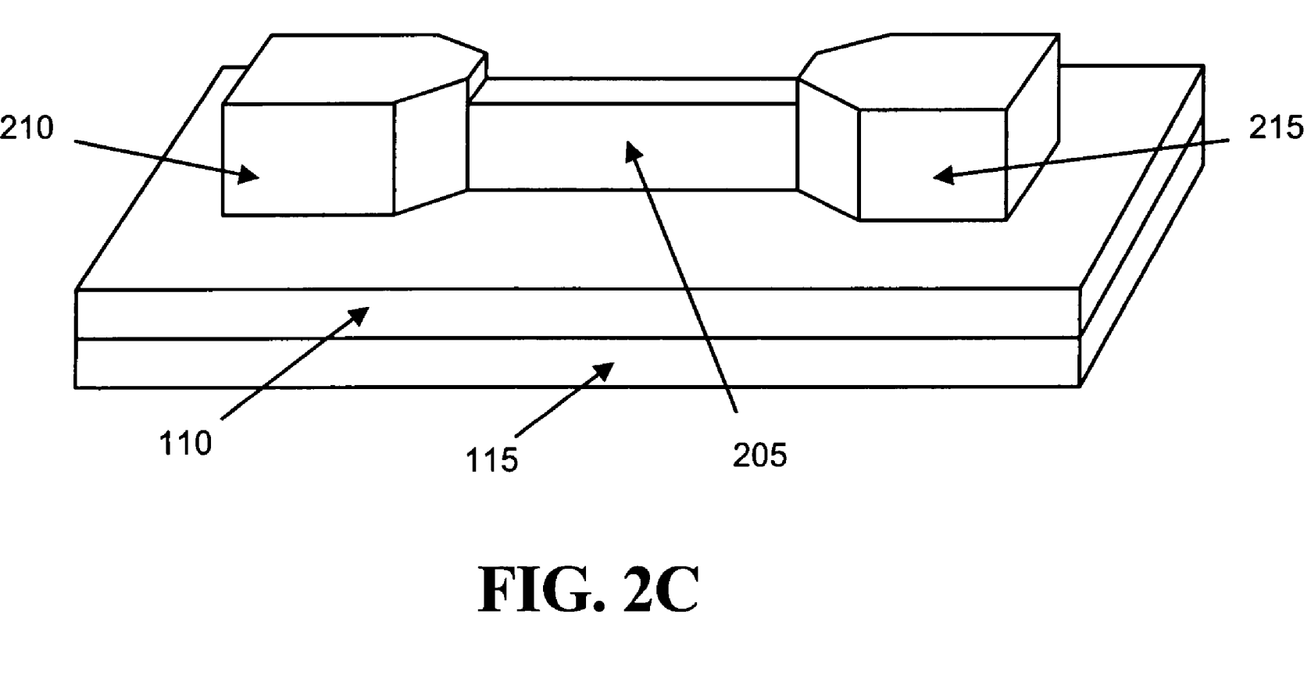
Figure 2D:
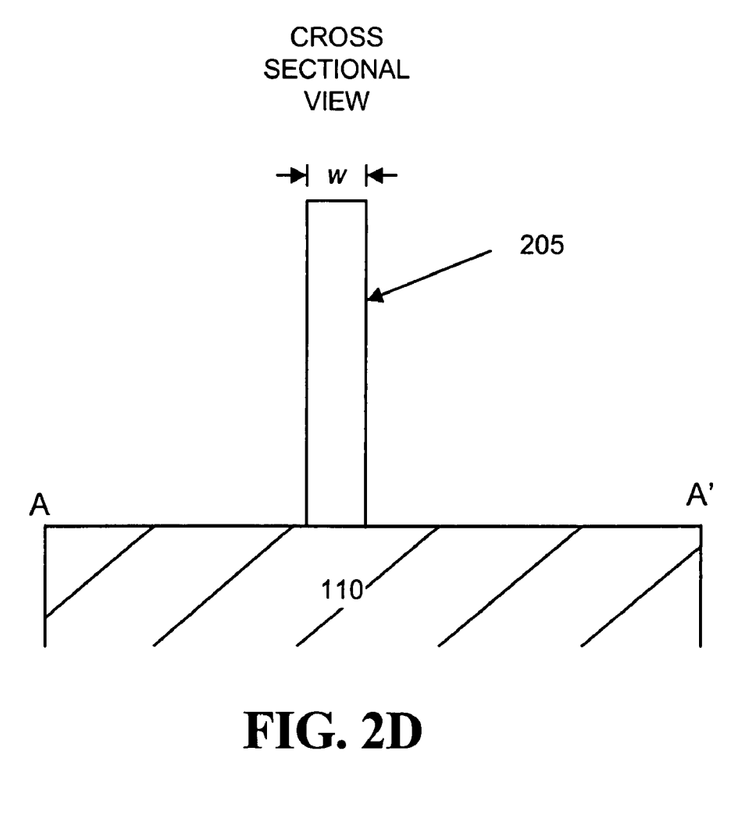
FIG. 2D illustrates a cross-sectional view of the exemplary fin of FIG. 2A consistent with the invention.

As shown in FIGS. 2A and 2D, a vertical fin 205 may be formed from fin layer 105. Fin 205 may be formed, for example, with a width (w) in a range of 10–15 nm. Fin 205 may be formed from fin layer 105 using any conventional process, including, but not limited to, conventional photolithographic and etching processes.

Subsequent to formation of fin 205, source 210 and drain 215 regions may be formed adjacent respective ends of fin 205, as shown in FIGS. 2B and 2C. Source 210 and drain 215 regions may be formed by, for example, deposition of a layer of semiconducting material over fin 205. The source 210 and drain 215 regions may be formed from the layer of semiconducting material using, for example, conventional photolithographic and etching processes. One skilled in the art will recognize, however, that other existing techniques may be used for forming source 210 and drain 215 regions. For example, source 210 and drain 215 regions may be formed by patterning and etching fin layer 105. Source 210 and drain 215 regions may include a semiconducting material such as, for example, silicon, germanium or silicon-germanium (Si—Ge). In one implementation, $Si_xGe_{(1-x)}$, with x approximately equal to 0.7 may be used.

Figure 3A:
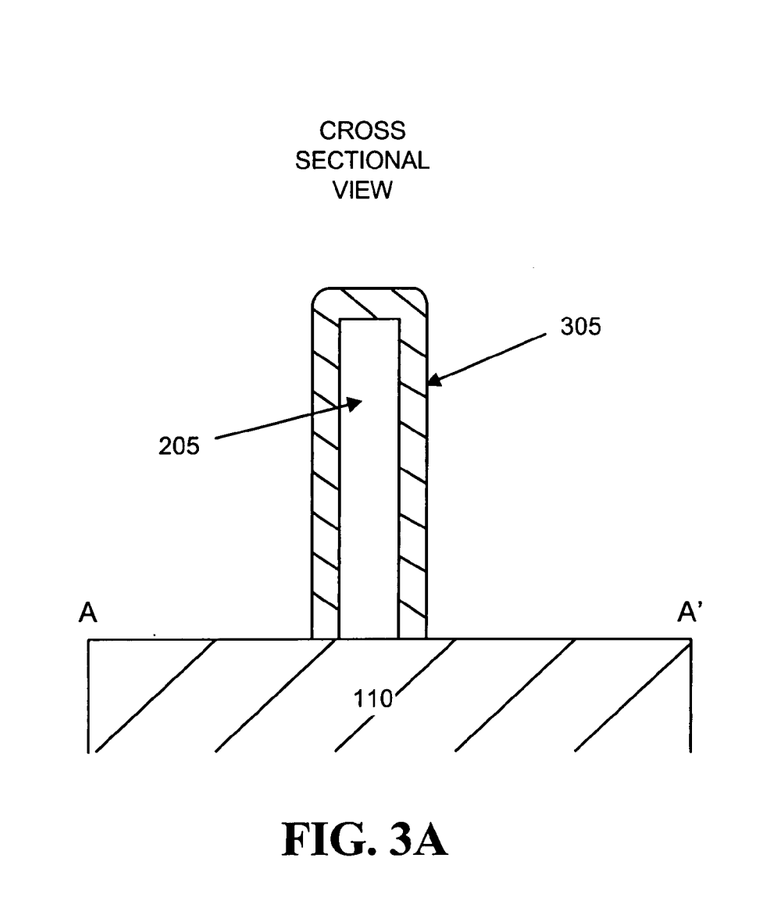
FIG. 3A illustrates a cross-sectional view of a layer of sacrificial oxide formed on the fin of FIG. 2A consistent with the invention.

After formation of source 210 and drain 215 regions, a sacrificial oxide layer 305 may be formed on fin 205, source 210 and drain 215, as shown in FIG. 3A. Sacrificial oxide layer 305 may be formed on fin 205, source 210 and drain 215 using any appropriate conventional process. In some exemplary embodiments, for example, sacrificial oxide layer 305 may be thermally grown on fin 205, source 210 and drain 215 to a thickness ranging from about 100 Å to about 1000 Å. Sacrificial oxide layer 305 may include, for example, silicon oxide, and may reduce buried oxide 110 undercut that may otherwise occur in subsequent etching steps of the FinFET process flow, thus, serving to substantially protect buried oxide layer 110.

Figure 3B:
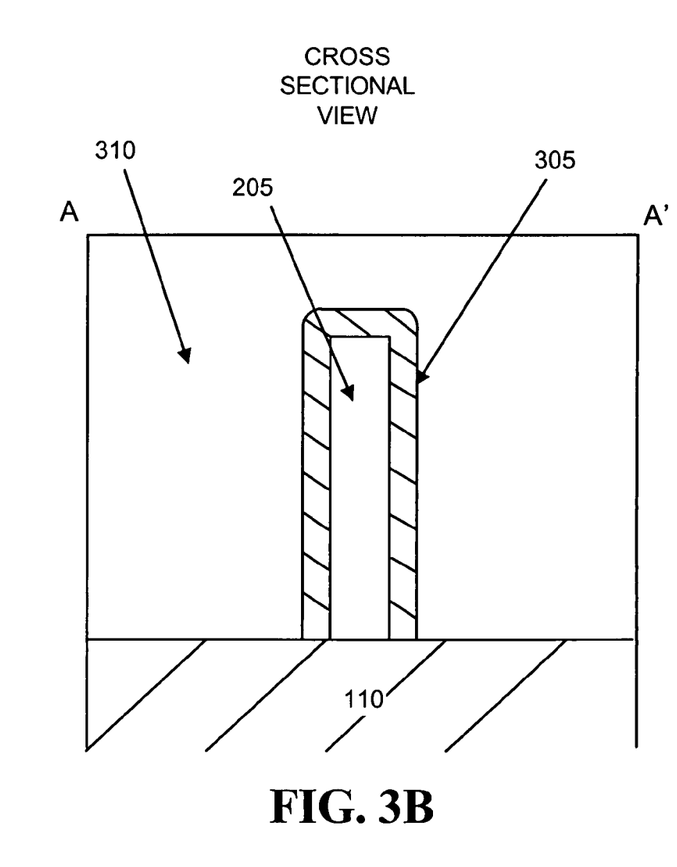
FIG. 3B illustrates a cross-sectional view of a polysilicon layer formed on the sacrificial oxide and fin of FIG. 3A consistent with the invention.
Figure 4A:
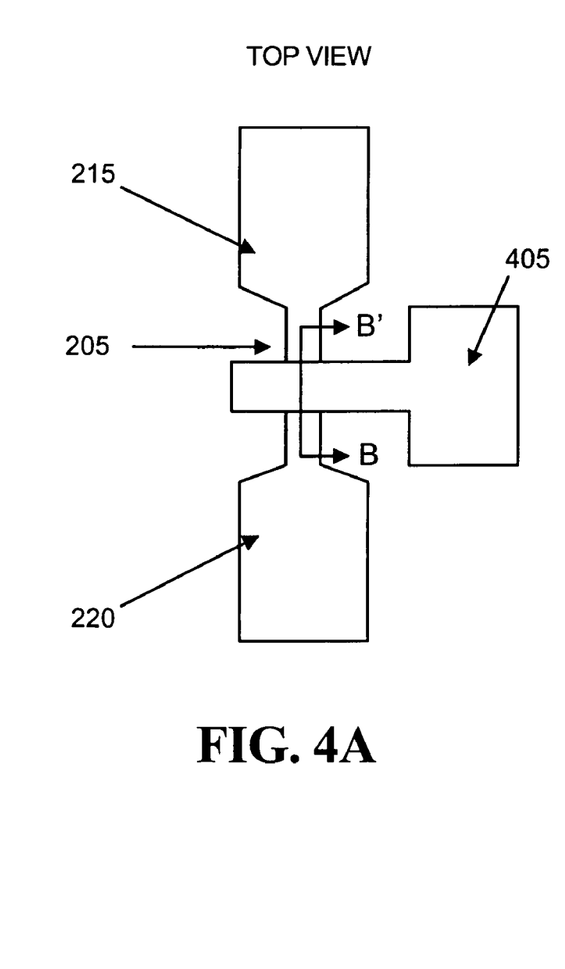
FIGS. 4A and 4B illustrate the formation of a dummy gate from the polysilicon layer of FIG. 3B consistent with the invention.
Figure 4B:
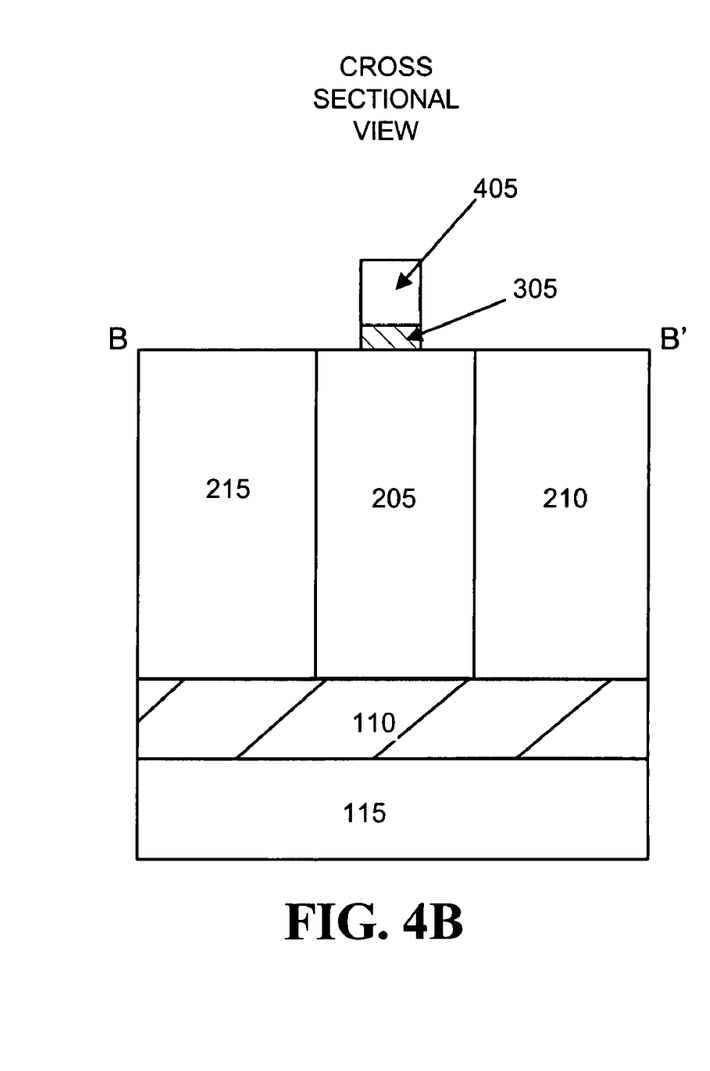

As further shown in FIG. 3B, a layer of polysilicon 310 may be formed over fin 205, source 210 and drain 215. The thickness of polysilicon layer 310 may range, for example, from about 100 Å to about 1000 Å. Polysilicon layer 310 may be polished back using, for example, a chemical-mechanical polishing (CMP) process, to achieve a planar surface to improve subsequent gate lithography. As shown in FIGS. 4A and 4B, a dummy gate 405 may be defined in polysilicon layer 310 using a conventional process, such as, for example, a conventional patterning and etching process.

Figure 5:
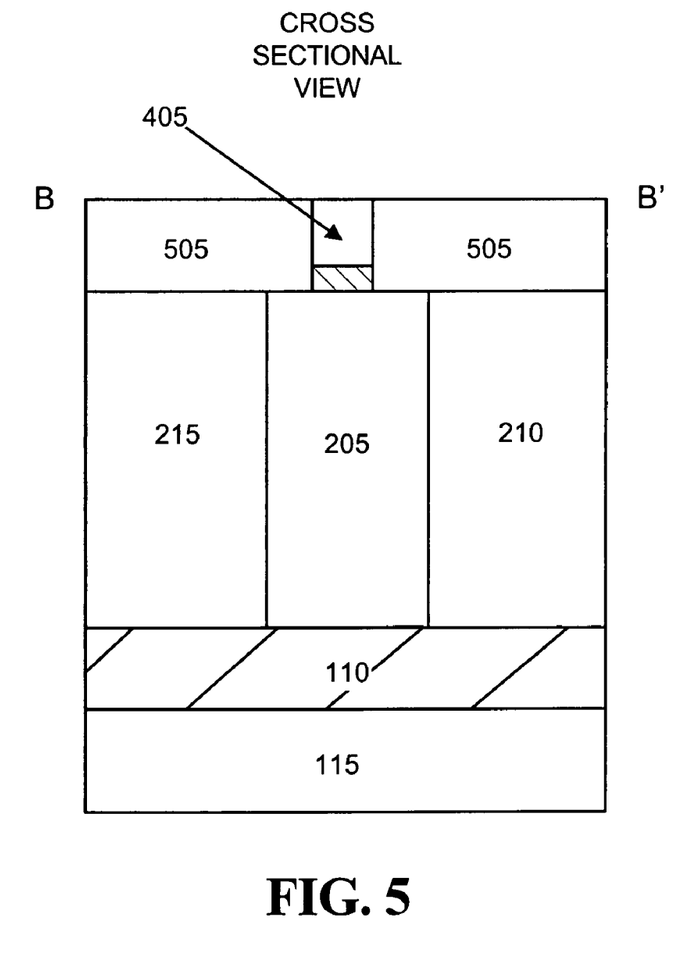
FIG. 5 illustrates the formation of a dielectric layer adjacent the dummy gate of FIGS. 4A and 4B consistent with the present invention.

As shown in FIG. 5, a dielectric layer 505 may be formed over dummy gate 405 using, for example, conventional deposition processes. Dielectric layer 505 may include, for example, tetraethylorthosilicate (TEOS), or any other dielectric material. The thickness of dielectric layer 505 may range, for example, from about 500 Å to about 3000 Å. Dielectric layer 505 may then be polished back to the upper surface of dummy gate 405 using, for example, a CMP process, as illustrated in FIG. 5.

Figure 6:
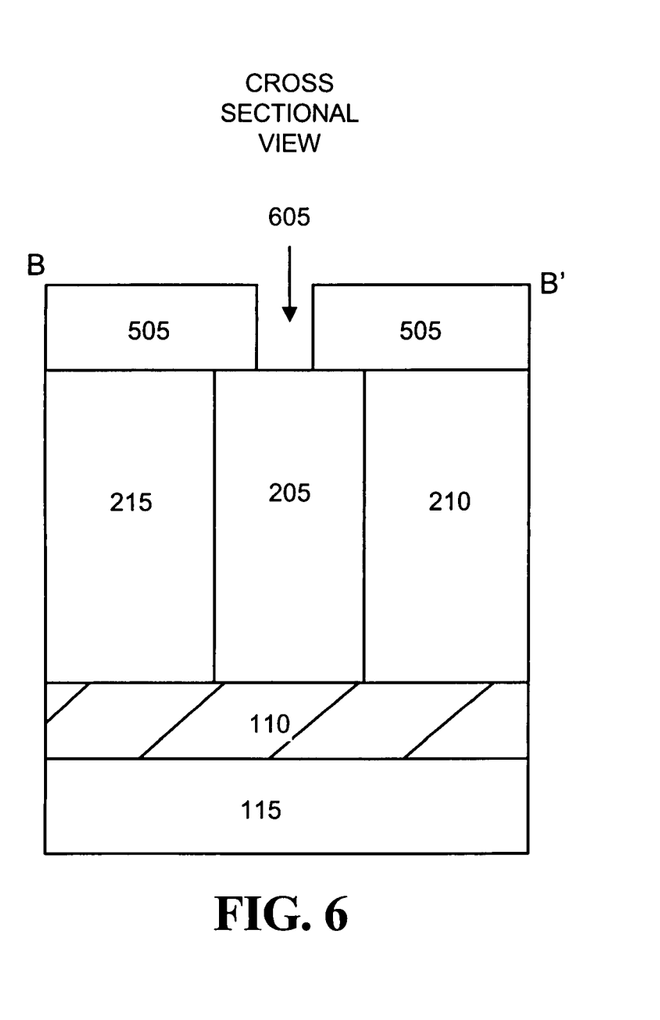
FIG. 6 illustrates the removal of the dummy gate of FIGS. 4A and 4B to form a gate trench consistent with the present invention.
Figure 7:
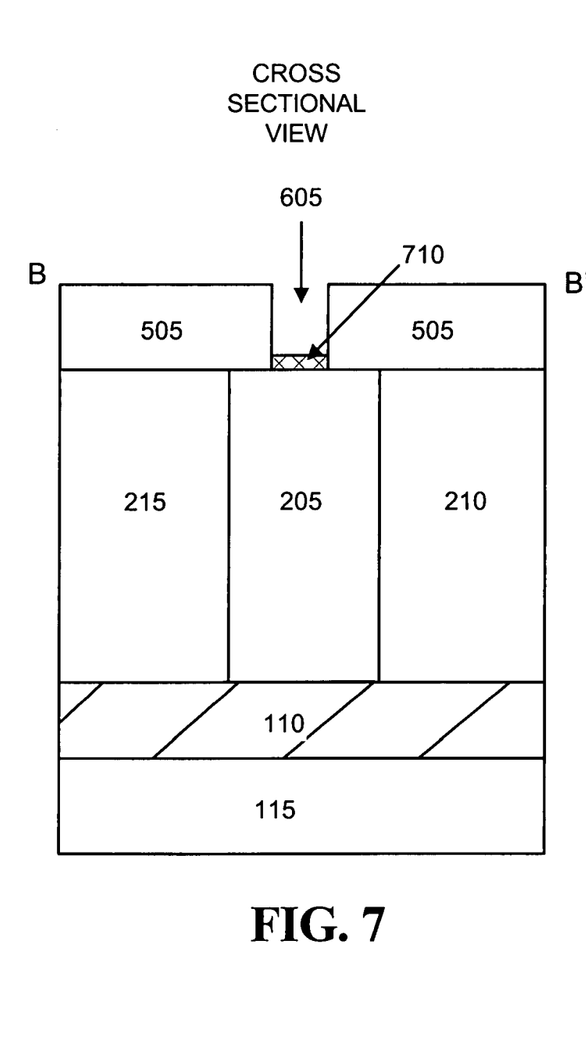
FIG. 7 illustrates formation of gate insulation within the gate trench of FIG. 6 consistent with the present invention.

Dummy gate 405 and sacrificial oxide 305 may then be removed, as shown in FIG. 6, leaving a gate trench 605. Dummy gate 405 and sacrificial oxide 305 may be removed using, for example, conventional etching processes. Gate insulation 710 may then be formed in gate trench 605, as shown in FIG. 7. Gate insulation 710 may be thermally grown or deposited using conventional deposition processes. Gate insulation 710 may include SiO, $SiO_2$, SiN, SiON, $HFO_2$, $ZrO_2$, $Al_2O_3$, HFSiO(x) ZnS, $MgF_2$, or other high-K dielectric materials.

Figure 8A:
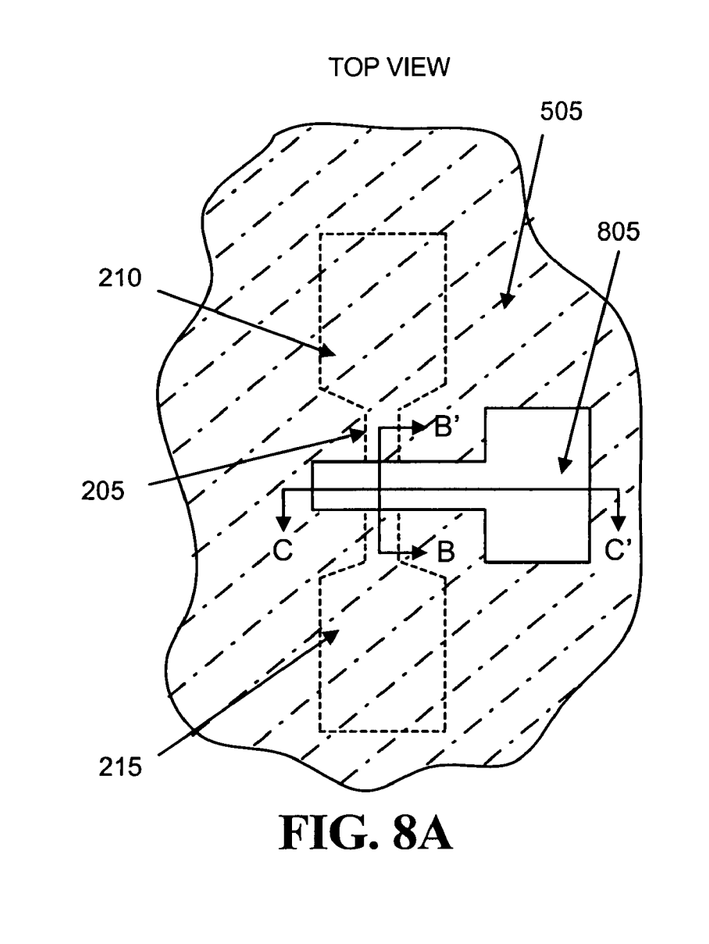
FIGS. 8A, 8B and 8C illustrate formation of a gate within the gate trench of FIG. 7 consistent with the present invention.
Figure 8B:
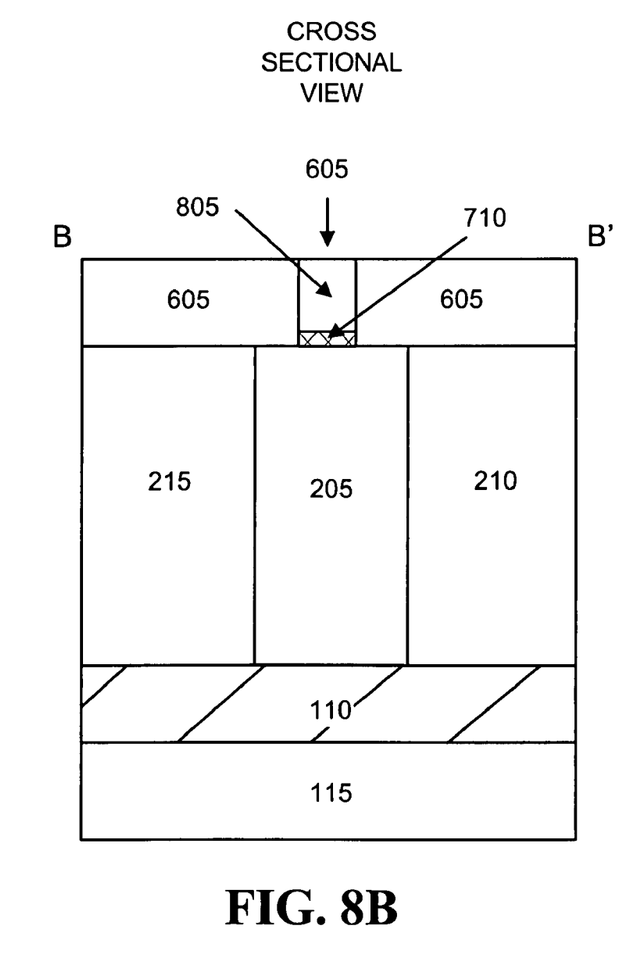
Figure 8C:
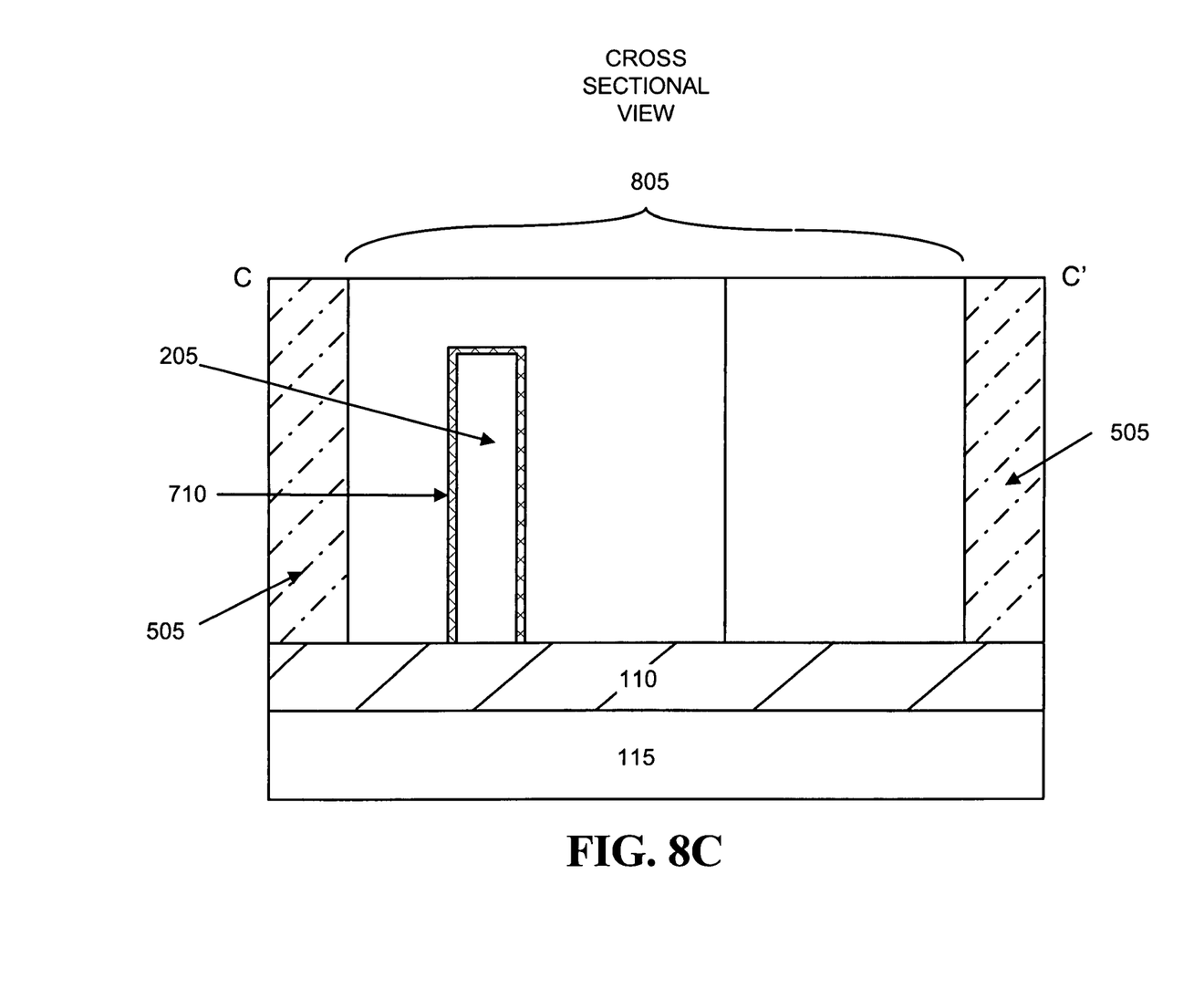

As shown in FIGS. 8A, 8B and 8C, a gate 805 may be formed in gate trench 605 over gate insulation 710 to complete the FinFET process flow. Gate 805 may be formed in gate trench 605 using a conventional deposition process and polished back to the upper surface of dielectric layer 505. Gate 805 may include a metal material, such as, for example, TiN, though other materials may be used. In the manner described above, a FinFET may be fabricated using a damascene process while minimizing undercutting of buried oxide layer 110. Advantageously, the resulting FinFET device exhibits improved performance.

Exemplary Active Lines Formed by Metal Induced Crystalization

Figure 9A:
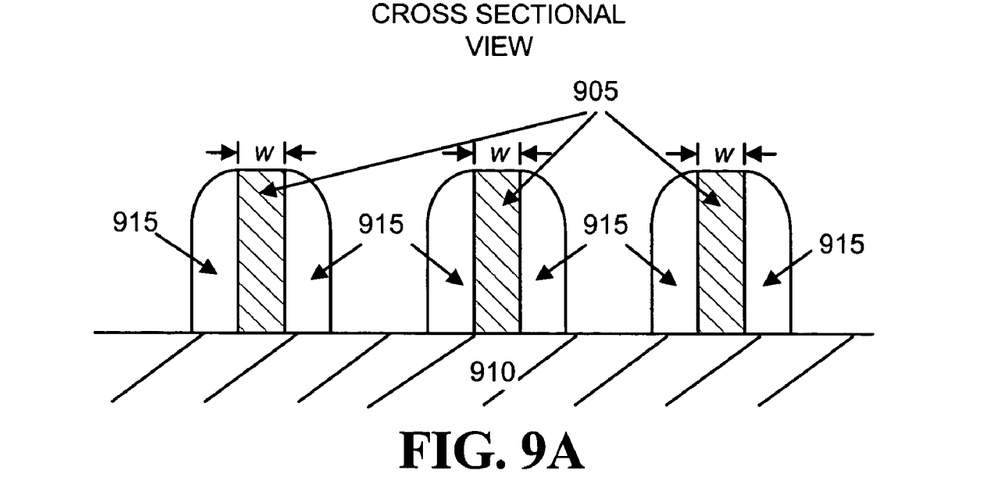
FIGS. 9A and 9B illustrate amorphous silicon lines formed adjacent silicon oxide spacers consistent with another embodiment of the invention.
Figure 9B:
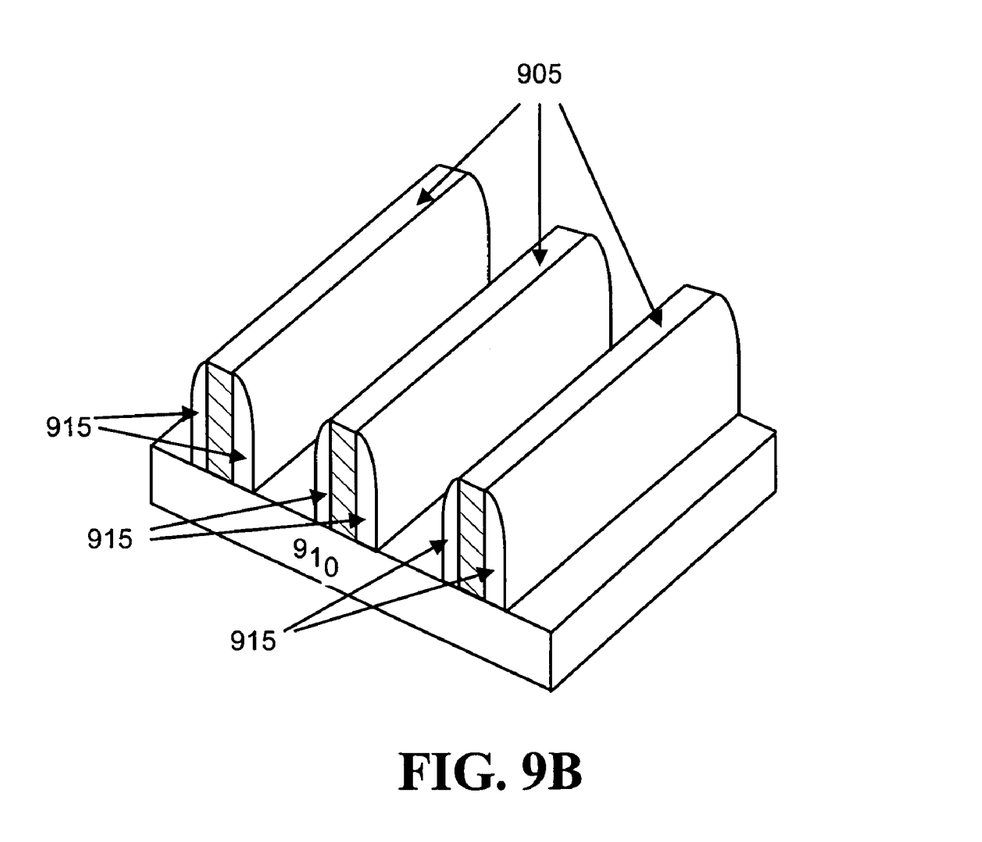

FIGS. 9A, 9B, 10 and 11 illustrate an exemplary process, consistent with another embodiment of the present invention, for forming crystal silicon lines using a metal induced crystallization process. As shown in FIGS. 9A and 9B, the exemplary process may begin with the formation of $SiO_2$ spacers 905 on a buried oxide layer 910. Spacers 905 may be formed, for example, by patterning and etching a layer of $SiO_2$ to form the multiple spacers. Spacers 905 may be formed, for example, with a width (w) in a range of 10–50 nm. Subsequent to formation of spacers 905, amorphous silicon (α-Si) structures 915 may be formed on each of the sidewalls of the spacers 905. Amorphous silicon structures 915 may be formed, for example, via conventional deposition and etching processes.

Figure 10:
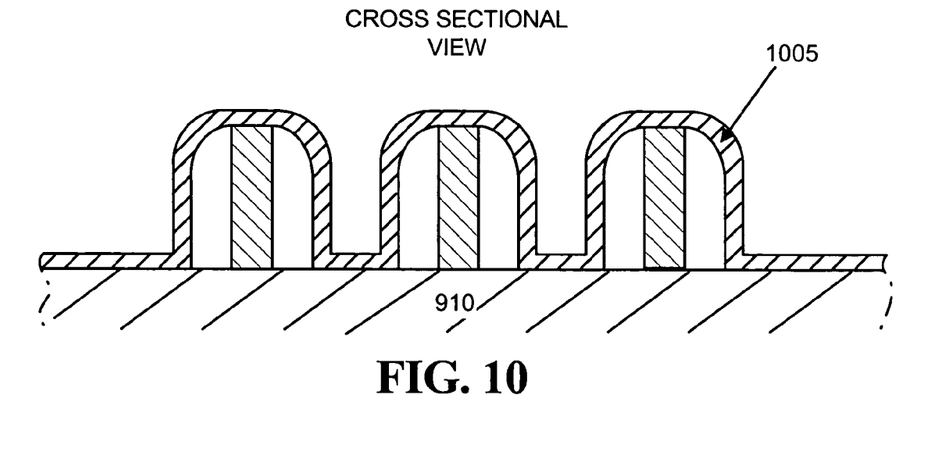
FIG. 10 illustrates formation and annealing of a nickel layer over the spacers and amorphous silicon lines of FIGS. 9A and 9B consistent with another embodiment of the invention.
Figure 11:
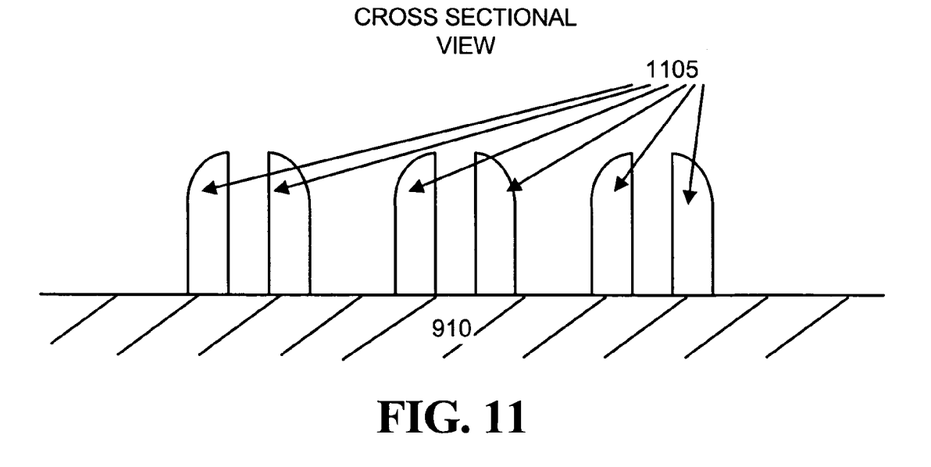
FIG. 11 illustrates removal of the spacers of FIGS. 9A and 9B to produce crystal silicon lines consistent with another embodiment.

A nickel layer 1005 may then be formed over spacers 905 and amorphous silicon structures 915, as shown in FIG. 10. Nickel layer 1005 may be formed, for example, using conventional deposition processes. The thickness of nickel layer 1005 may range, for example, from about 10 Å to about 20 Å. After deposition of nickel layer 1005, the layer 1005 may be annealed to convert the amorphous silicon structures 915 to crystalline silicon via metal induced crystallization. Nickel layer 1005 and spacers 905 may then be removed to leave active crystalline silicon lines 1105, as shown in FIG. 11. Nickel layer 1005 and spacers 905 may be removed, for example, using conventional etching processes. The crystalline silicon lines 1105 may then be used as fins in a subsequently etched FinFET.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of reducing buried oxide undercut during FinFET formation, comprising:
    forming a fin on a buried oxide layer;
    forming a source region adjacent a first end of the fin and a drain region adjacent a second end of the fin, the fin, source region and drain region each having an upper surface and a plurality of side surfaces;
    forming a sacrificial oxide layer over the upper surfaces and the plurality of side surfaces of the fin and source and drain regions; and
    forming a gate over the fin, wherein the sacrificial oxide layer reduces undercutting of the buried oxide layer during gate formation.

2. The method of claim 1, wherein forming the gate over the fin comprises:
    forming a dummy gate comprising a first material in a first pattern over the fin;
    forming a dielectric layer adjacent sides of the dummy gate;
    removing the first material to form a trench in the dielectric layer corresponding to the first pattern; and
    forming the gate in the trench.

3. The method of claim 2, wherein the dielectric layer comprises tetraethylorthosilicate.

4. The method of claim 2, further comprising:
    forming a gate insulation layer in the trench prior to forming the gate.

5. The method of claim 4, wherein the gate insulation layer comprises at least one of SiO, $SiO_2$, SiN, SiON, $HFO_2$, $ZrO_2$, $Al_2O_3$, HFSiO(x) ZnS, or $MgF_2$.

6. The method of claim 2, wherein the first material comprises polysilicon.

7. The method of claim 2, wherein forming the dummy gate comprises:
    depositing a layer comprising the first material over the sacrificial oxide layer and the fin; and
    etching the layer comprising the first material to form the dummy gate in the first pattern.

8. The method of claim 2, wherein forming the gate comprises:
    depositing a metal material to fill the trench.

9. The method of claim 1, wherein the sacrificial oxide layer comprises silicon oxide.

10. The method of claim 9, wherein the sacrificial oxide layer has a thickness ranging from about 100 Å to about 500 Å.

11. A method of forming a fin field effect transistor, comprising:
    forming a fin upon a buried oxide layer;
    forming a source region adjacent a first end of the fin and a drain region adjacent a second end of the fin, the fin, source region and drain region each having an upper surface and a plurality of side surfaces;
    forming a sacrificial oxide layer over the upper surfaces and the plurality of side surfaces of the fin and source and drain regions;
    depositing a layer comprising a first material over the fin and sacrificial oxide layer;
    etching the layer comprising the first material to form a dummy gate, wherein the sacrificial oxide layer reduces undercutting of the buried oxide layer during the etching;
    depositing a dielectric layer over the dummy gate and source and drain regions;
    planarizing the dielectric layer to expose a top surface of the dummy gate;
    removing the layer comprising the first material to form a trench in the dielectric layer;
    forming a gate insulation layer in the trench; and
    forming a final gate in the trench.

12. The method of claim 11, wherein the dielectric layer comprises tetraethylorthosilicate.

13. The method of claim 11, wherein the first material comprises polysilicon.

14. The method of claim 11, wherein the gate insulation layer comprises at least one of SiO, $SiO_2$, SiN, SiON, $HFO_2$, $ZrO_2$, $Al_2O_3$, HFSiO(x) ZnS, or $MgF_2$.

15. The method of claim 11, wherein the sacrificial oxide layer comprises silicon oxide.

16. The method of claim 11, wherein the sacrificial oxide layer has a thickness ranging from about 100 Å to about 500 Å.

17. The method of claim 11, wherein the final gate comprises a metal.

* * * * *